(12) United States Patent
Laskaris et al.

(10) Patent No.: US 6,215,383 B1
(45) Date of Patent: Apr. 10, 2001

(54) MAGNET WITH SHIELDING

(75) Inventors: Evangelos Trifon Laskaris, Niskayuna; Michael Anthony Palmo, Ballston Spa; Michele Dollar Ogle, Burnt Hills, all of NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/419,237

(22) Filed: Oct. 15, 1999

Related U.S. Application Data

(60) Provisional application No. 60/129,441, filed on Apr. 15, 1999, provisional application No. 60/129,438, filed on Apr. 15, 1999, and provisional application No. 60/129,439, filed on Apr. 15, 1999.

(51) Int. Cl.$^7$ .......................................... H01F 5/00
(52) U.S. Cl. ........................ 335/299; 335/216; 335/296
(58) Field of Search ............................ 335/299, 216, 335/300, 301; 324/319–321

(56) References Cited

U.S. PATENT DOCUMENTS

| | | | |
|---|---|---|---|
| 4,689,591 | * 8/1987 | McDougal | 335/299 |
| 5,517,168 | 5/1996 | Dorri et al. | 335/301 |
| 5,517,169 | 5/1996 | Laskaris et al. | 335/301 |
| 5,565,831 | 10/1996 | Dorri et al. | 335/216 |
| 5,568,102 | * 10/1996 | Dorri et al. | 335/216 |
| 5,568,110 | 10/1996 | Dorri et al. | 335/216 |
| 5,570,073 | 10/1996 | Muller | 335/299 |
| 5,574,417 | 11/1996 | Dorri et al. | 335/216 |
| 5,594,401 | 1/1997 | Dorri et al. | 335/216 |
| 5,721,523 | 2/1998 | Dorri et al. | 335/216 |
| 5,801,609 | * 9/1998 | Laskaris et al. | 335/216 |
| 5,874,880 | 2/1999 | Laskaris et al. | 335/216 |
| 5,874,882 | 2/1999 | Laskaris et al. | 335/299 |
| 5,883,558 | 3/1999 | Laskaris et al. | 335/216 |
| 5,900,792 | * 5/1999 | Havens et al. | 335/216 |

OTHER PUBLICATIONS

Laskaris et al., Application entitled "Open Magnet Having Shielding", filed Nov. 24, 1998, S.N. 09/199,096.
Laskaris et al., Application entitled "Open Magnet With Shielding", filed Nov. 24, 1998, S.N. 09/199,095.
Laskaris et al., Application entitled "Apparatus and Magnet For a Superconductive Magnet With Pole Piece", filed Aug. 31, 1999, S.N. 09/385,407.

* cited by examiner

*Primary Examiner*—Lincoln Donovan
*Assistant Examiner*—Tuyen T. Nguyen
(74) *Attorney, Agent, or Firm*—Marvin Snyder; Douglas E. Stoner

(57) ABSTRACT

A magnet, such as a closed, superconductive, magnetic-resonance-imaging (MRI) magnet includes a main coil, a magnetizable article, and a shielding coil positioned radially outward from the main coil and magnetizable article. Two magnetizable members are positioned radially outward from the main coil and magnetizable article and radially inward from the shielding coil to supplement the strength, and increase the homogeneity of, the magnetic field created, at least in part, by the main coil and magnetizable article and to supplement the shielding provided, at least in part, by the shielding coil.

20 Claims, 2 Drawing Sheets

MAGNET WITH SHIELDING

This application claims priority of: a Provisional Application entitled "Hybrid Shield MRI Magnet" by Evangelos T. Laskaris et al., Ser. No. 60/129,441 filed Apr. 15, 1999; a Provisional Application entitled "Short Hybrid Shield MRI Magnet" by Evangelos T. Laskaris et al., Ser. No. 60/129,438 filed Apr. 15, 1999; and a Provisional Application entitled "Hybrid Shield Short MRI Magnet" by Evangelos T. Laskaris et al., Ser. No. 60/129,439 filed Apr. 15, 1999; and is copending with U.S. patent applications Ser. Nos. 09/419,236 and 09/419,238 by Evangelos T. Laskaris et al, both filed Oct. 15, 1999.

BACKGROUND OF THE INVENTION

The present invention relates generally to a magnet, and more particularly to a magnet having shielding to protect the area around the magnet from stray magnetic fields originating from the magnet.

Magnets are used in diverse applications such as MRI (magnetic resonance imaging) systems. MRI systems include those employing superconductive magnets for medical diagnostics and procedures. Known superconductive MRI magnet designs include those having superconductive main coils each carrying a large, identical electric current in the same direction. The superconductive main coils create a static magnetic field within an MRI imaging volume which typically has the shape of a sphere centered within the magnet's bore where the object to be imaged is placed.

Superconductive magnets having shielding include those having superconductive shielding coils and those having a cylindrical iron shield. The superconductive shielding coils carry electric currents of generally equal amperage, but in an opposite direction, to the electric current carried in the superconductive main coils. The superconductive shielding coils are positioned radially outward from the superconductive main coils to prevent the high magnetic field created by and surrounding the superconductive main coils from adversely interacting with electronic equipment in the vicinity of the magnet. Likewise, the cylindrical iron shield is positioned radially outward from the superconductive main coils to prevent the high magnetic field created by and surrounding the superconductive main coils from adversely interacting with electronic equipment in the vicinity of the magnet.

Short magnets with a uniform field, as would be used for MRI, may achieve field uniformity by use of superconductive bucking coils, permanent magnet rings, and iron rings placed radially inward of the main coils. Iron rings are low in cost, but, when positioned in the magnet bore, they must be temperature controlled to maintain a highly uniform field. In addition, the iron rings may interact with other MRI imaging components. Shielding short magnets with a thick iron shield adversely affects field uniformity.

Superconductive magnets having superconductive shielding coils use nearly twice as much superconductor as unshielded magnets. Short magnets with superconductive bucking coils for field correction use more superconductor than longer magnets without the bucking coils. What is needed is a short magnet having shielding which is not as expensive as known designs and which is without the problems associated with iron rings in the warm magnet bore.

BRIEF SUMMARY OF THE INVENTION

In a first expression of the invention, a magnet includes a longitudinally-extending axis, at least one main coil, at least one magnetizable article, at least one shielding coil, and at least two magnetizable members. The at least one main coil is generally coaxially aligned with the axis and carries an electric current in a first direction. The at least one magnetizable article is longitudinally spaced apart from the at least one main coil and does not carry an electric current. The at least one shielding coil is generally coaxially aligned with the axis, is positioned radially outward from the at least one main coil and magnetizable article, and carries an electric current in an opposite direction to the first direction. The at least two magnetizable members are not carrying an electric current, are longitudinally spaced apart from each other, are positioned radially outward from the at least one main coil and magnetizable article, and are positioned radially inward from the at least one shielding coil.

In a second expression of the invention, a closed, superconductive, magnetic-resonance-imaging (MRI) magnet includes a longitudinally-extending axis, longitudinally-outermost superconductive first and second main coils, first and second magnetizable rings, superconductive first and second shielding coils, and annularly-cylindrical first and second magnetizable members. The first and second main coils are generally coaxially aligned with the axis and carry an electric current in a first direction. The first and second correction magnetizable rings are generally coaxially aligned with the axis, are positioned longitudinally between the first and second main coils, and do not carry an electric current. The first and second shielding coils are generally coaxially aligned with the axis, are positioned radially outward from the first and second main coils and magnetizable rings, and carry an electric current in an opposite direction to the first direction. The first and second magnetizable members are not carrying an electric current, are positioned radially outward from the first and second main and coils and magnetizable rings, and are positioned radially inward from the first and second shielding coils. The first magnetizable member at least partially longitudinally overlaps the first main coil, and the second magnetizable member at least partially longitudinally overlaps the second main coil.

Several benefits and advantages are derived from the invention. The at least two (or the first and second) magnetizable members, being located radially inward from the at least one (or the first and second) shielding coil, supplement the strength, and increase the homogeneity of, the magnetic field created, at least in part, by the at least one (or the first and second) main coil and magnetizable article (or rings). The at least two (or the first and second) magnetizable members, being located radially outward from the at least one (or the first and second) main coil and magnetizable article (or rings), provide extra shielding and thus supplement the shielding provided, at least in part, by the at least one (or the first and second) shielding coil. The at least one magnetizable article (or the first and second magnetizable rings) will shorten the magnet (typically by about ten percent) and should result in a net longitudinally-inward electromagnetic (em) force experienced by the first and second (i.e., the longitudinally-outermost) main coils. For a 1.5 Tesla superconductive magnet, wherein the at least two (or the first and second) magnetizable members are annularly-cylindrical iron members, engineering calculations show superconductor use is reduced by at least 25% while magnet weight is increased by about 40% to generally 12,000 pounds. It is noted that a magnet weighing 12,000 pounds easily can be placed in medical buildings without expensive structural reinforcement. The projected cost savings (mainly in saved superconductor costs) over a similar magnet which relies only on its bigger superconductive shielding coils for shielding is about 10,000 US dollars.

DETAILED DESCRIPTION OF THE INVENTION

Figure 1:
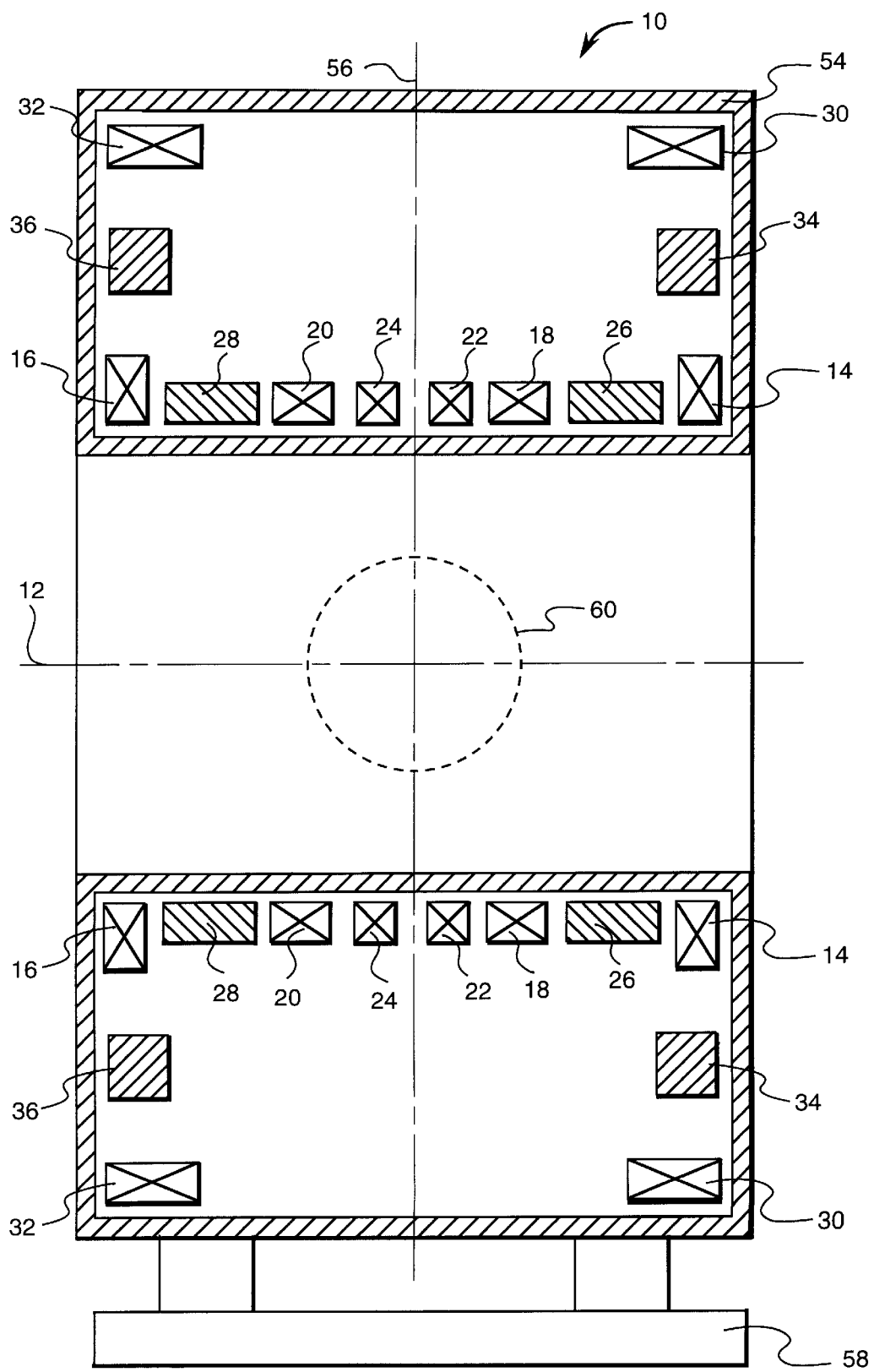
FIG. 1 is a schematic, cross-sectional, side-elevational view of a first embodiment of the magnet of the invention.
Figure 2:
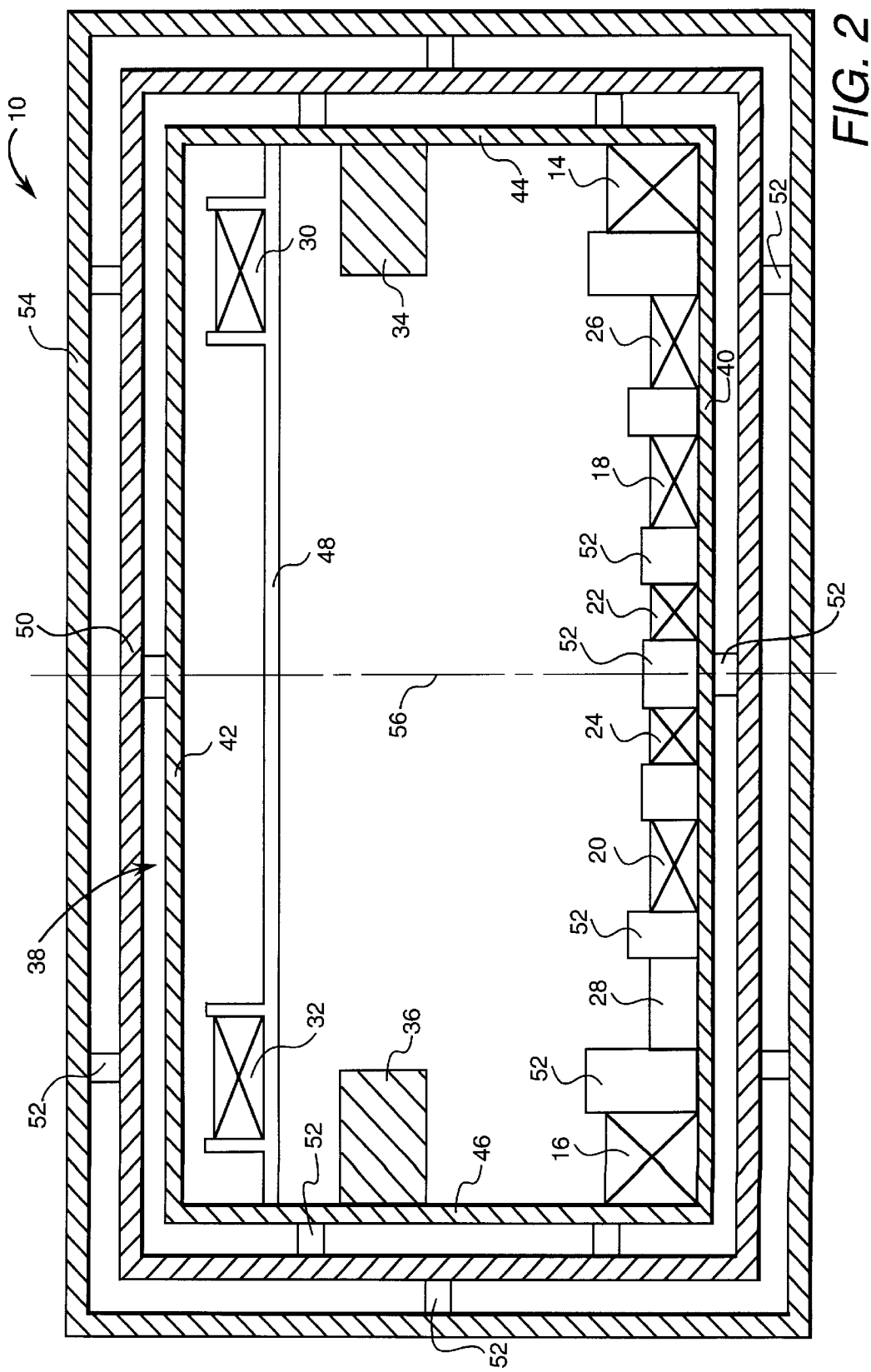
FIG. 2 is a more detailed view of the upper portion of the magnet of FIG. 1.

Referring now to the drawings, FIGS. 1 and 2 show a first embodiment of the magnet 10 of the present invention. In one example, magnet 10 is a closed superconductive magnet. In one application, magnet 10 is part of an MRI (magnetic resonance imaging) system (not shown) used for medical diagnostics and procedures.

In one expression of the first embodiment of the invention, a magnet 10 includes a longitudinally-extending axis 12, at least one main coil 14, 16, 18, 20, 22, and 24 (hereinafter expressed as 14–24), at least one magnetizable article 26 and 28, at least one shielding coil 30 and 32, and at least two magnetizable members 34 and 36 which are not carrying an electric current. The at least one main coil 14–24 is generally coaxially aligned with the axis 12 and carries an electric current in a first direction. The first direction is defined to be either a clockwise or a counterclockwise circumferential direction about the axis 12 with any slight longitudinal component of current direction being ignored. The at least one magnetizable article 26 and 28 is generally coaxially aligned with the axis 12, is longitudinally spaced apart from the at least one main coil 14–24, and does not carry an electric current. The at least one shielding coil 30 and 32 is generally coaxially aligned with the axis 12, is disposed radially outward from the at least one main coil and magnetizable article 14–24 and 26–28 (also expressed as 26 and 28), and carries an electric current in an opposite direction to the first direction. The at least two magnetizable-members 34 and 36 are longitudinally spaced apart from each other, are disposed radially outward from the at least one main coil and magnetizable article 14–24 and 26–28, and are disposed radially inward from the at least one shielding coil 30 and 32.

In one example, the at least one shielding coil 30 and 32 consists of at least one superconductive shielding coil. In another example, the at least one main coil 14–24 consists of at least one superconductive main coil. Superconductive cooling may be achieved by employing cryogenic fluids and/or cryocooler coldheads, and the like, as is known to the artisan. The magnetizable articles 26 and 28 are contained in the cryocooled region. As seen in FIG. 2, in one construction, magnet 10 includes an annularly-cylindrical helium (or other cryogenic fluid) vessel 38 having a radially-inner wall 40, a radially-outer wall 42, and first and second longitudinal end walls 44 and 46. The helium vessel 38 encloses the at least one main and shielding coils 14–24 and 30–32 (also expressed as 30 and 32), the at least one magnetizable article 26 and 28, and the at least two magnetizable members 34 and 36. The radially-inner wall 40 defines a coil support for said at least one main coil 14–24, and the at least one main coil 14–24 is wound around the radially-inner wall 40. At least one of the at least two magnetizable members 34 and 36 is attached to the first longitudinal end wall 44, and at least one other of the at least two magnetizable members 34 and 36 is attached to the second longitudinal end wall 46. The at least one shielding coil 30 and 32 is wound around a coil support 48 which is attached to the first and second longitudinal end walls 44 and 46. At least one thermal shield 50 is spaced apart from (using conventional spacers 52) and generally surrounds the helium vessel 38, and a vacuum enclosure 54 is spaced apart from (using conventional spacers 52) and encloses the at least one thermal shield 50. It is seen from FIG. 1 that magnet 10 is generally symmetrical about a plane (seen on edge as a dashed line 56) which is perpendicular to the axis 12 and which is disposed equidistant from the longitudinal ends of the vacuum enclosure 54. The vacuum enclosure 54 is supported by a floor mount 58. It is noted that, when there is more than one at least one main coil 14–24 and/or magnetizable article 26 and 28, conventional spacers 52 may also be used to longitudinally separate and position these coils 14–24 and magnetizable articles 26 and 28.

In one design, at least one of the at least two magnetizable members 34 and 36 at least partially longitudinally overlaps or underlaps at least one of the at least one main and shielding coils 14–24 and 30–32. In another design, at least one of the at least two magnetizable members 34 and 36 at least partially longitudinally overlaps at least one of the at least one main coil 14–24 and at least partially longitudinally underlaps at least one of the at least one shielding coil 30 and 32. In a further design, at least one of the at least two magnetizable members 34 and 36 completely longitudinally overlaps at least one of the at least one main coil 14–24, and, in one variation, at least one of the at least two magnetizable members 34 and 36 also at least partially longitudinally underlaps at least one of the at least one shielding coil 30 and 32. In one construction, the at least two magnetizable members 34 and 36 are at least two annularly-cylindrical magnetizable members generally coaxially aligned with the axis 12, and the at least one magnetizable article 26 and 28 is at least one magnetizable ring generally coaxially aligned with the axis 12.

In another expression of the first embodiment of the invention, a closed, superconductive, magnetic-resonance-imaging (MRI) magnet 10 includes a longitudinally-extending axis 12, longitudinally-outermost superconductive first and second main coils 14 and 16, first and second magnetizable rings 26 and 28, superconductive first and second shielding coils 30 and 32, and annularly-cylindrical first and second magnetizable members 34 and 36 which are not carrying an electric current. The first and second main coils 14 and 16 are generally coaxially aligned with the axis 12 and carry an electric current in a first direction, as previously defined. The first and second magnetizable rings 26 and 28 are generally coaxially aligned with the axis 12, are disposed longitudinally between the first and second main coils 14 and 16, and do not carry an electric current. The first and second shielding coils 30 and 32 are generally coaxially aligned with the axis 12, are disposed radially outward from the first and second main coils 14 & 16 and magnetizable rings 26 & 28, and carry an electric current in an opposite direction to the previously-described first direction. The first and second magnetizable members 34 and 36 are disposed radially outward from the first and second main coils 14 & 16 and magnetizable rings 26 & 28 and are disposed radially inward from the first and second shielding coils 30 and 32. The first magnetizable member 34 at least partially longitudinally overlaps the first main coil 14, and the second magnetizable member 36 at least partially longitudinally overlaps the second main coil 16.

As seen in FIG. 2, in one construction, magnet 10 includes an annularly-cylindrical helium (or other cryogenic fluid)

vessel 38 having a radially-inner wall 40, a radially-outer wall 42, and first and second longitudinal end walls 44 and 46. The helium vessel 38 encloses the first and second main and shielding coils 14 & 16 and 30 & 32, the first and second magnetizable rings 26 and 28, and the first and second magnetizable members 34 and 36. The radially-inner wall 40 defines a coil support for the first and second main coils 14 & 16, and the first and second main coils 14 & 16 are wound around the radially-inner wall 40. The first magnetizable member 34 is attached to the first longitudinal end wall 44, and the second magnetizable member 36 is attached to the second longitudinal end wall 46. The first and second shielding coils 30 and 32 are wound around a coil support 48 which is attached to the first and second longitudinal end walls 44 and 46.

In one design, the first shielding coil 30 at least partially longitudinally overlaps the first main coil 14, and the second shielding coil 32 at least partially longitudinally overlaps the second main coil 16. In another design, the magnet 10 includes superconductive third and fourth main coils 18 and 20 generally coaxially aligned with the axis 12, disposed radially inward from the first and second magnetizable members 34 and 36, disposed longitudinally between the first and second magnetizable rings 26 and 28, and carrying an electric current in the previously-described first direction. In one variation, the magnet 10 also includes superconductive fifth and sixth main coils 22 and 24 generally coaxially aligned with the axis 12, disposed radially inward from the first and second magnetizable members 34 and 36, disposed longitudinally between the third and fourth main coils 18 and 20, and carrying an electric current in the previously-described first direction. In one example, all of the coils 14–24 carrying an electric current in the previously-described first direction are disposed radially inward from the first and second magnetizable members 34 and 36. In one design, the first and second shielding coils 30 and 32 are the only coils carrying an electric current in the previously-described opposite direction that are disposed radially outward from the first and second magnetizable members 34 and 36. In another design, the first and second magnetizable rings 26 and 28 are the only magnetizable articles not carrying an electric current that are disposed radially inward from the first and second magnetizable members 34 and 36. In an additional design, the first and second magnetizable members 34 and 36 are the only magnetizable members of the magnet 10 not carrying an electric current that are disposed radially inward from the first and second shielding coils 30 and 32 and radially outward from the first and second main coils 14 & 16. In one construction, the first and second magnetizable members 34 and 36 are generally coaxially aligned with the axis 12.

It is noted that those skilled in the art, using computer simulations based on conventional magnetic field analysis techniques, and using the teachings of the present invention, can design a shielded superconductive magnet 10 of a desired magnetic field strength, a desired level of magnetic field inhomogeneity, and a desired level of shielding (i.e., a desired position of the 5 Gauss stray field from the center of the imaging volume 60 [shown as a dashed circle in FIG. 1] of the superconductive magnet).

The at least two (or the first and second) magnetizable members 34 and 36, being located radially inward from the at least one (or the first and second) shielding coil 30 and 32, supplement the strength, and increase the homogeneity of, the magnetic field created, at least in part, by the at least one (or the first and second) main coil 14–24 (or 14 and 16) and magnetizable article (or rings) 26 and 28. The at least two (or the first and second) magnetizable members 34 and 36, being located radially outward from the at least one (or the first and second) main coil 14–24 (or 14 and 16) and magnetizable article (or rings) 26 and 28, provide extra shielding and thus supplement the shielding provided, at least in part, by the at least one (or the first and second) shielding coil 30 and 32. The at least one magnetizable article (or the first and second magnetizable rings) 26 and 28 will shorten the magnet (typically by about ten percent) and should result in a net longitudinally-inward electromagnetic (em) force experienced by the first and second (i.e., the longitudinally-outermost) main coils 14 and 16 thereby removing the em force previously experienced by the first and second longitudinal end walls 44 and 46 of the helium vessel 38 allowing for a less robust structural design, as can be appreciated by those skilled in the art. For a 1.5 Tesla superconductive magnet, wherein the at least two (or the first and second) magnetizable members 34 and 36 are annularly-cylindrical iron members, engineering calculations show superconductor use is reduced by at least 25% while magnet weight is increased by about 40% to generally 12,000 pounds. It is noted that a magnet weighing 12,000 pounds easily can be placed in medical buildings without expensive structural reinforcement. The projected cost savings (mainly in saved superconductor costs) over a similar magnet which relies only on its bigger superconductive shielding coils for shielding is about 10,000 US dollars. The magnetizable articles (e.g., rings) 26 and 28, being in the cryocooled region, shorten the magnet 10 without thermal control problems and without interaction with MRI gradient coils, as can be appreciated by the artisan.

Although not shown in the figures, engineering calculations show that superconductive first and second correction coils (not shown in the figures) can be substituted for the first and second magnetizable rings 26 and 28 to also shorten the magnet. The first and second correction coils would carry an electric current in the previously-described opposite direction and should result in a reduced longitudinally-outward em force experienced by the first and second main coils 14 and 16 thereby reducing the em force previously experienced by the first and second longitudinal end walls 44 and 46. Engineering calculations also show that magnet weight and superconductor savings (but not magnet shortening or reduced em forces) can be achieved by eliminating the first and second magnetizable rings 26 and 26 and by substituting a magnetizable member (not shown in the figures) for the first and second magnetizable members 34 and 36. Such magnetizable member extends longitudinally from the first longitudinal end wall 44 to the second longitudinal end wall 46, has a radial thickness with a reduced radial-thickness section extending from the plane 56 longitudinally outward generally half way to the first and second longitudinal end walls 40 and 42, and has a radially-inward-facing surface with a concave portion extending from the plane 56 longitudinally outward generally half way to the first and second longitudinal end walls 40 and 42.

The foregoing description of two expressions of a first embodiment of the invention has been presented for purposes of illustration. It is not intended to be exhaustive or to limit the invention to the precise form disclosed, and obviously many modifications and variations are possible in light of the above teaching. It is intended that the scope of the invention be defined by the claims appended hereto.

What is claimed is:

1. A magnet with magnetic shielding comprising:
   a) a longitudinally-extending axis;
   b) at least one main coil positioned around said axis and carrying an electric current in a first direction;

c) at least one magnetizable correction ring positioned around said axis longitudinally spaced apart from said at least one main coil and not carrying an electric current;

d) at least one shielding coil positioned around said axis, disposed radially outward from said at least one main coil and magnetizable article, and carrying an electric current in said opposite direction to said first direction; and e) at least two magnetizable annular members which are not carrying an electric current, which are positioned around said axis and are longitudinally spaced apart from each other, which are disposed radially outward from said at least one main coil and magnetizable article, and which are disposed radially inward from said at least one shielding coil.

2. The magnet of claim 1, wherein said at least one shielding coil consists of at least one superconductive shielding coil.

3. The magnet of claim 2, wherein said at least one main coil consists of at least two superconductive main coils and said at least one correction ring is positioned intermediate said at least two superconductive main coils.

4. The magnet of claim 3, wherein at least one of said at least two magnetizable members at least partially longitudinally overlaps or underlaps at least one of said at least one main and shielding coils.

5. The magnet of claim 4, wherein at least one of said at least two magnetizable members at least partially longitudinally overlaps at least one of said at least one main coil and at least partially longitudinally underlaps at least one of said at least one shielding coil.

6. The magnet of claim 4, wherein at least one of said at least two magnetizable members completely longitudinally overlaps at least one of said at least one main coil.

7. The magnet of claim 6, wherein at least one of said at least one magnetizable members at least partially longitudinally underlaps at least one of said at least one shielding coil.

8. The magnet of claim 1, wherein said at least two magnetizable members are at least two annularly-cylindrical magnetizable members generally coaxially aligned with said axis and wherein said at least one magnetizable article is at least one magnetizable ring generally coaxially aligned with said axis.

9. The magnet of claim 1, also including an annularly-cylindrical helium vessel having a radially-inner wall, a radially-outer wall, and first and second longitudinal end walls, wherein said helium vessel encloses said at least one main and shielding coils and magnetizable article and said at least two magnetizable members, wherein said radially-inner wall defines a coil support for said at least one main coil, and wherein said at least one main coil is wound around said radially-inner wall.

10. The magnet of claim 9, wherein at least one of said at least two magnetizable members is attached to said first longitudinal end wall and wherein at least one other of said at least two magnetizable members is attached to said second longitudinal end wall.

11. A closed, superconductive, magnetic-resonance-imaging (MRI) magnet with magnetic shielding comprising:

a) a longitudinally-extending axis;

b) longitudinally-outermost from the center of said longitudinally-extending axis superconductive first and second main coils coaxially aligned with said longitudinally-extending axis and carrying an electric current in a first direction;

c) first and second magnetizable rings coaxially aligned with said axis, disposed longitudinally between said first and second main coils, and not carrying an electric current;

d) superconductive first and second shielding coils coaxially aligned with said axis, disposed radially outward from said first and second main coils and magnetizable rings, and carrying an electric current in an opposite direction to said first direction; and e) annularly-cylindrical first and second magnetizable members which are not carrying an electric current, which are disposed radially outward from said first and second main coils and magnetizable rings, and which are disposed radially inward from said first and second shielding coils; wherein said first magnetizable member at least partially longitudinally overlaps said first main coil and wherein said second magnetizable member at least partially longitudinally overlaps said second main coil.

12. The magnet of claim 11, wherein said first shielding coil at least partially longitudinally overlaps said first main coil and wherein said second shielding coil at least partially longitudinally overlaps said second main coil.

13. The magnet of claim 11, wherein all of said coils carrying an electric current in said first direction are disposed radially inward from said first and second magnetizable members.

14. The magnet of claim 11, wherein said first and second magnetizable members are coaxially aligned with said axis.

15. The magnet of claim 14, also including superconductive third and fourth main coils coaxially aligned with said axis, disposed radially inward from said first and second magnetizable members, disposed longitudinally between said first and second magnetizable rings, and carrying an electric current in said first direction.

16. The magnet of claim 15, also including superconductive fifth and sixth main coils generally coaxially aligned with said axis, disposed radially inward from said first and second magnetizable members, disposed longitudinally between said third and fourth main coils, and carrying an electric current in said first direction.

17. The magnet of claim 16, wherein said first and second magnetizable rings are the only magnetizable articles not carrying an electric current that are disposed radially inward from said first and second magnetizable members.

18. The magnet of claim 17, wherein said first and second shielding coils are the only coils carrying an electric current in said opposite direction that are disposed radially outward from said first and second magnetizable members.

19. The magnet of claim 11, also including an annularly-cylindrical helium vessel having a radially-inner wall, a radially-outer wall, and first and second longitudinal end walls, wherein said helium vessel encloses said first and second main and shielding coils and said first and second magnetizable rings and members, wherein said radially-inner wall defines a coil support for said first and second main coils, and wherein said first and second main coils are wound around said radially-inner wall.

20. The magnet of claim 19, wherein said first magnetizable member is attached to said first longitudinal end wall and wherein said second magnetizable member is attached to said second longitudinal end wall.

* * * * *